United States Patent
Kashyap et al.

(10) Patent No.: US 7,673,268 B2
(45) Date of Patent: Mar. 2, 2010

(54) METHOD AND SYSTEM FOR INCORPORATING VIA REDUNDANCY IN TIMING ANALYSIS

(75) Inventors: Madhur Kashyap, Noida (IN); Arijit Dutta, Bangalore (IN)

(73) Assignee: Freescale Semiconductor, Inc., Austin, TX (US)

( * ) Notice: Subject to any disclaimer, the term of this patent is extended or adjusted under 35 U.S.C. 154(b) by 328 days.

(21) Appl. No.: 11/737,759

(22) Filed: Apr. 20, 2007

(65) Prior Publication Data

US 2007/0256042 A1 Nov. 1, 2007

(30) Foreign Application Priority Data

May 1, 2006 (IN) .................. 1098/DEL/2006

(51) Int. Cl.
*G06F 17/50* (2006.01)
(52) U.S. Cl. .............................. 716/6; 716/1
(58) Field of Classification Search .......... 716/1, 716/6
See application file for complete search history.

(56) References Cited

U.S. PATENT DOCUMENTS

| | | | |
|---|---|---|---|
| 5,798,937 A | 8/1998 | Bracha et al. | |
| 6,026,224 A * | 2/2000 | Darden et al. | 716/10 |
| 6,425,115 B1 * | 7/2002 | Risler et al. | 716/17 |
| 2003/0101399 A1 * | 5/2003 | Yoshikawa | 714/744 |
| 2005/0015740 A1 | 1/2005 | Sawicki et al. | |
| 2006/0095879 A1 * | 5/2006 | Brahme et al. | 716/6 |
| 2006/0101367 A1 * | 5/2006 | Fujita et al. | 716/10 |
| 2006/0225005 A1 * | 10/2006 | Correale et al. | 716/2 |
| 2006/0265684 A1 * | 11/2006 | Buehler et al. | 716/12 |
| 2009/0055788 A1 * | 2/2009 | Cote et al. | 716/6 |
| 2009/0113366 A1 * | 4/2009 | Serdar et al. | 716/6 |

OTHER PUBLICATIONS http://wwvv.itrs.net/Links/2004Update/2004_08_Interconnect. pdf.

Bing-Yue Tsui, Chih-Wei Chen, Shien-Ming Huang and Shyue-Shyh Lin, "Process Sensitivity and Robustness Analysis of Via-First Dual Damascene Process", IEEE Tran. Semi. Manuf., vol. 16, No. 2, May 2003.

Makoto Ueki, Masayuki Hiroi, Nobuyuki Ikarashi, Takahiro Onodera, Naoya Furutake, Naoya Inoue, and Yoshihiro Hayashi, "Effects of Ti addition on via Reliability in Cu Dual Damascene Interconnects", IEEE Tran. Elec. Dev., vol. 15, No. 11, Nov. 2004.

(Continued)

*Primary Examiner*—Jack Chiang
*Assistant Examiner*—Suchin Parihar
(74) *Attorney, Agent, or Firm*—Charles Bergere

(57) ABSTRACT

A method of conducting timing analysis on an integrated circuit design includes performing a first routing operation on the design to generate a first routed design that includes redundant vias, and storing the first routed design in a first design database, and performing a second routing operation on the synthesized design to generate a second routed design that does not include redundant vias, and storing the second routed design in a second design database. Then, extractions are performed on the first and second designs and delay calculations are performing on the first and second extractions files. The first and second delay calculations are compared to determine a delay difference between the first and second designs and timing analysis is performed using the delay difference.

16 Claims, 3 Drawing Sheets

OTHER PUBLICATIONS

Y. Sun, Z. Peng, D. Kim, K. Goodson and S. Wong, "Recovery of Open Via after Electromigration in Cu Dual Damascene Interconnect," IEEE International Reliability Physics Symposium Proceedings, pp. 435-436, Dallas, TX, Apr. 2002.

G. Xu, L. Huang, D.Z. Pan, and M.D.-F Wong, "Redundant-Via Enhanced Maze Routing for Yield Improvement", Proc. Asia South Pacific Design Automation Conference (ASPDAC), Jan. 2005.

* cited by examiner

METHOD AND SYSTEM FOR INCORPORATING VIA REDUNDANCY IN TIMING ANALYSIS

BACKGROUND OF THE INVENTION

The present invention relates generally to semiconductor integrated circuits having redundant vias and, more particularly, to a method and system for performing accurate timing analysis of integrated circuits having redundant vias.

Vias are openings or conductive lines formed in dielectric layers of a semiconductor chip. The dielectric layers insulate conductive layers, which contain circuit elements, such as transistors. In present day chips, millions of vias may be used to form a complex system of interconnections for circuit elements located in stacks of conductive layers. FIG. 1 shows a single via 10 connecting a first metal layer 12 to a second metal layer 14.

To improve the speed and performance of a chip, engineers constantly strive to design circuits that are more compact so that more circuit elements may be placed in the chip. One way to achieve these goals is to increase via density and decrease via size. However, a major problem with shrinking via dimensions is that even the slightest manufacturing error may cause a via to fail. For example, if the via is too small, it may not provide a suitable electrical connection between two conductive layers. Integrated circuits typically include a number of critical vias. One example of a critical via is a via that provides the only electrical connection between two conductive layers. Such a via is also referred to as a "stand-alone" or "single transition" via. The failure of a critical via may render the entire integrated circuit inoperable and cause great financial loss.

One method of increasing the functional yield of the integrated circuit and reducing the risk of via failure is to add redundant vias to the circuit. Redundant via software may be used to scan the circuit to determine suitable locations for forming additional vias in close proximity to a critical via. If a suitable location is found, then a redundant via may be formed and connected in parallel with the critical via. Thus, if the critical via fails, the redundant via acts as a backup so that the critical electrical connection is not lost. FIG. 2 shows a redundant via 16 located proximate to the via 10.

Another method of reducing the risk of via failure is to form fat vias. FIG. 3 shows a fat via 18. The fat via 18 includes the via 10 as well as a metal extension 20. Though the use of redundant and fat vias has resulted in improved integrated circuit yield, the presence of the additional vias may have a number of adverse effects. For example, because each redundant via adds a metal track to the chip, the capacitance of the surrounding region may be undesirably altered. Additionally, redundant vias may disrupt the timing of the circuit, upon which many electronic devices rely, particularly since it is difficult to determine whether both or only one via is functioning after manufacturing is complete.

If both vias are functioning, then the resistance of the via pair would be only half of the resistance if only one via is functioning. In addition, the disparity between the two resistances varies throughout the circuit, particularly between maximum capacitance corners and minimum capacitance corners. For example, the difference between double and single vias is particularly pronounced at maximum capacitance extraction corners, where the ratio of metal to via resistance is smaller.

Because the number of functioning vias is difficult to predict when a via has been duplicated, it is likewise difficult to predict what effect the vias may have on various aspects of circuit timing, such as stage delay, output transition time, and ripple effect of signal slews. In some cases, circuit timing may be improved, but in other cases, the timing may be worse. Unfortunately, because the results are unpredictable, it is very difficult to compensate for timing problems and violations. In addition, because the addition of redundant vias typically occurs during design rule checking and chip finalization, most of the routes are frozen before the timing errors are discovered and thus difficult to correct.

After an integrated circuit is designed, it is typically tested and analyzed to ensure that the circuit will not violate the timing constraints of the design. One method commonly used to test and verify the timing performance of the circuit is static timing analysis (STA). To ensure proper circuit operation, the design is first subject to physical synthesis to lay out the circuit at the gate level, followed by interconnect routing and parasitic extraction. STA is then used to identify the various timing paths of the circuit and then analyze signal propagation delay over the paths.

Typically, a longest path analysis and a shortest path analysis are performed on the circuit to determine whether a signal arrives during the active pulse of a clock. If the signal arrives in time, then the timing constraints of the path are met and a timing violation is avoided. The amount of time by which the violation is avoided is referred to as the slack, which is also an indication of the margin of error from the timing violation. If the signal does not arrive in time, then there is a timing violation, which results in a negative slack.

As described previously, via doubling is generally used in locations of a semiconductor chip where the chances of via failure are high. However, via doubling has the disadvantages of it being difficult to predict how many vias are functioning and therefore the resistance of the vias, and the presence of redundant vias alters the capacitance of the circuit, which may affect signal propagation at certain circuit pathways. Thus, when an integrated circuit includes redundant or fat vias, which is increasingly common, the risk of timing violations is greatly increased.

Accordingly, it would be desirable to have a method and a system for performing accurate timing analysis on integrated circuits that have redundant and fat vias regardless of whether only one or both of the critical and redundant vias are functioning.

BRIEF DESCRIPTION OF THE DRAWINGS

The following detailed description of preferred embodiments of the invention will be better understood when read in conjunction with the appended drawings. The present invention is illustrated by way of example and not limited by the accompanying figures, in which like references indicate similar elements.

Those skilled in the art will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE INVENTION

A method and a system for incorporating via redundancy in timing analysis are provided. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention. It also is to be understood that the same or equivalent functions may be accomplished by different embodiments that are intended to be encompassed within the spirit and scope of the invention.

In the description, the following acronyms are used:
DEF: Design Exchange Format, used to maintain details of placed and routed design.
DRC: Design Rule Checking, e.g., checking metal polygons for minimum allowed spacing therebetween.
ECO: Engineering Change Order
EMA: Electromigration Analysis
GDSII: Graphic Design System II, Format of final design tape out of database.
LEF: Library Exchange Format, used to maintain abstracts of library cells used for routing.
NA: Noise Analysis
STA: Static Timing Analysis The present invention provides a method of conducting timing analysis on an integrated circuit design including performing a routing operation on the design to generate a routed design. The routed design is processed for redundant and fat via insertion to generate two design databases, a first one that contains redundant and fat vias and, a second one that does not include the redundant and fat vias. Then, extractions are performed on the first and second designs followed by delay calculations on the first and second extractions files. The first and second delay calculations are compared to determine a delay difference between the first and second designs and timing analysis is performed using the delay difference and second delay calculations.

Figure 1:
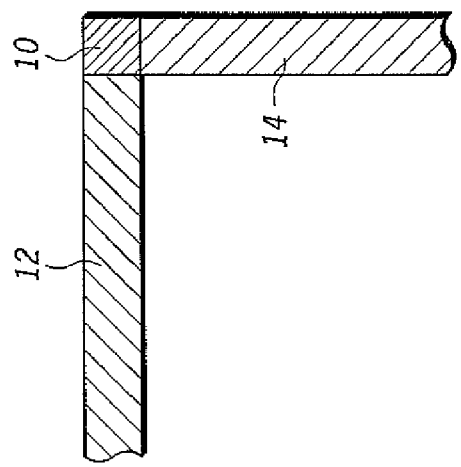
FIG. 1 is a schematic diagram of a routing trace showing a single via connecting two metal layers.
Figure 2:
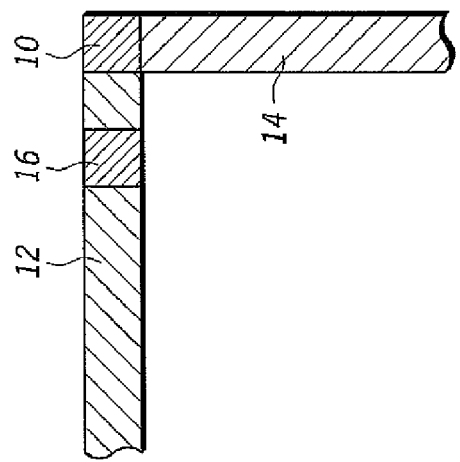
FIG. 2 is a schematic diagram of the routing trace of FIG. 1 with the addition of a redundant via.
Figure 3:
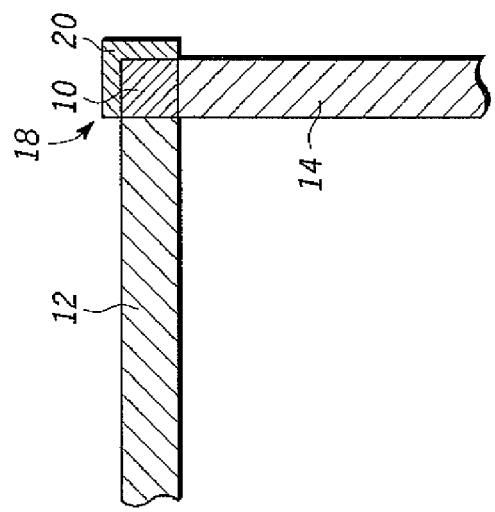
FIG. 3 is a schematic diagram of the routing trace of FIG. 1 in which the single via has an additional metal enclosure or metal extension.
Figure 4:
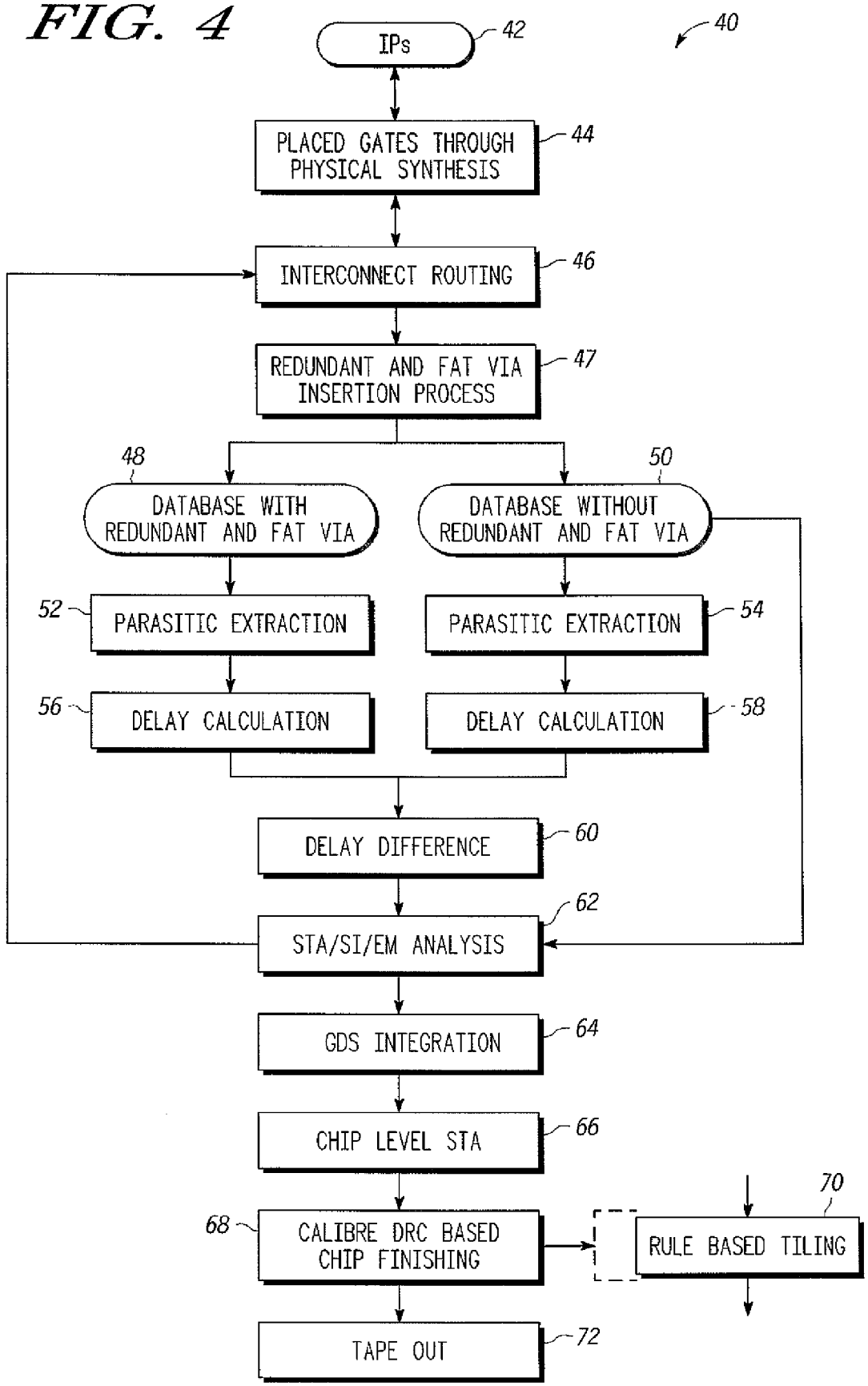
FIG. 4 is a flow chart of a method of conducting timing analysis on an integrated circuit in accordance with an embodiment of the present invention.

Referring now to FIG. 4, a flow chart of a method 40 for conducting timing analysis on an integrated circuit in accordance with one embodiment of the present invention is shown. The method 40 begins by providing a circuit design of an integrated circuit at step 42. The circuit design may be any type of circuit design such as a System on a Chip (SOC) a processor, or an application specific integrated circuit (ASIC). The circuit design also may include one or more embedded memories of various types, such as RAM and ROM. The circuit design is synthesized at step 44. That is, the logical circuit design is converted to gates selected from a library of gates and placed and the gates are placed using an Electronic Design Automation (EDA) tool such as Synopsys. Physical Compiler™ from Synopsys, Inc. of Mountain View, Calif.

The placed gates are then connected in a routing step 46 using a commercially available router, such as NanoRoute Ultra™, from Cadence Design Systems, Inc. of San Jose, Calif., which generates a routed database. The routed database is processed for redundant and fat via insertion followed by automated or manual Design Rule Violation cleaning at step 47 using a commercially available tool, such as Nano-Route Ultra™, generating a database containing redundant and fat vias that has few or no design rule violations. It is important to note that the redundant and fat via database has a different interconnect topology compared to the routed database generated at step 46. The redundant and fat vias database is further processed using a PERL (Practical Extradition and Reporting Language) script to generate a second database containing only normal vias, shown at step 50. The Perl script can be directly invoked by the router. The two databases shown at steps 48 and 50 differ only for redundant via and extra metal enclosure and extension geometries.

At steps 52 and 54, parasitic extraction steps are performed using the respective first and second databases generated by the redundant and fat via insertion process. Again, a commercial extraction tool, such as StarRC-XT™ available from Synopsys, Inc. is used to perform the extraction steps 52 and 54. The extraction steps 52 and 54 can be executed either serially or in parallel.

At steps 56 and 58, which are preferably performed in parallel, delay calculations are generated using the data generated by the extraction steps 52 and 54. More particularly, at step 56, first delay calculation data is generated for the first set of data for each of the timing stages (i.e., sum of the gate timing arc and net timing arc) in the design. The delay calculation may be performed using for example, Primetime® from Synopsys to obtain minimum and maximum values for the rise and fall delays of each timing stage. Because the first set of data includes the redundant vias of the modified design, the first delay data represents the predicted delay of the integrated circuit design when both vias are functional. Meanwhile, at step 58, in the same manner as in step 56, second delay calculation data is generated using the extraction data generated at step 54 to obtain minimum and maximum values for the rise and fall delays of each timing stage. The second delay data is used to represent the predicted delay of the integrated circuit when none of the redundant vias are functioning, i.e., when all the redundant vias have failed or there are no redundant vias present in the design. As shown in FIG. 4, the two processes may proceed in parallel to ascertain the first and second delay data at the same time to avoid an increase in runtime. The first delay data (for the design with redundant vias) and the second delay data (for design without redundant vias) for each timing stage in the circuit design are stored as Set A and Set B, respectively, using TCL (Tool Command Language) scripts run within Primetime®.

At step 60, using the first and second delay data (Set A and Set B), a delay difference for the redundant vias for each of the timing stages in the circuit design is calculated. The delay difference may be calculated using a Perl script, which can also be run within Primetime®. The delay difference for a stage S in a circuit design having two data sets (e.g., Set A and Set B) may be determined as follows:

$$\text{Delta Delay}(min.,S) = \text{Delay}(min.,S,A) - \text{Delay}(min.,S,B);\text{ strictly negative values only.}$$

$$\text{Delta Delay}(max.,S) = \text{Delay}(max.,S,A) - \text{Delay}(max.,S,B);\text{ strictly positive values only.}$$

The delay difference or delta delay for each timing stage for each set of data is retained for subsequent analysis. Subsequent analysis, such as Signal Integrity (SI), EMA and STA are conducted at step 62 after incorporating the delta delay information into the Set B data. More particularly, for every timing stage, Delta Delay (max., S) is added to timing stages or paths during a maximum delay calculation (e.g., during a setup check) and Delta Delay (min., S) is added to stages during a minimum delay calculation (e.g., during a hold check) to ensure that worst case timing scenarios are taken into account for both cases (i.e., with and without redundant vias) and are analyzed in a single STA run.

The timing analysis performed at step 62 is used to determine whether a particular stage or path of the circuit design meets the timing constraints of the design in the worst case scenario, regardless if the stage has a redundant via or not. If a timing violation is detected and therefore the design does not meet certain timing requirements, the method 40 is redirected back to step 46 where the design is further modified or improved, such as by adding or removing vias, and two new sets of data are generated to represent the newly modified design. The process repeats thereafter as discussed above.

If the timing constraints of the design obtained from the STA at step 62 satisfy the timing requirements, the method 40 continues with integrating the design into GDS (Graphic Data System) format at step 64. If changes need to be made to the design to correct timing violations, LEF-DEF ECOs are performed on the database without the redundant vias. Once the circuit design is set at chip level, it becomes more difficult to correct any timing violations. By ensuring that the redundant vias are analyzed at the design level, the present invention is able to test for timing problems originating from redundant via addition at the design level where any associated problems are relatively easier to correct.

At step 66, chip level STA is performed. Again, Primetime® available from Synopsys, Inc. may be used. If STA at chip level meets timing requirements, Design Rule Checking (DRC) and chip finishing processes are conducted at step 68. Example DRC and chip finishing processes are rule based tiling, memory label addition, part logo addition, etc.

Subsequently, rule based tiling may be conducted, after the DRCs, at step 70 and before tape out at step 72. As understood by those of skill in the art, variations in layout pattern density can greatly affect the surface topography of an integrated circuit during CMP, which in turn can cause yield loss due to the lithography and etching issues of non-flat surfaces. One popular approach is to insert dummy features, features that are electrically inactive and are not for the purpose of optical assistance, into the layout to change the pattern density distribution. Methods for dummy filling are often referred to as "tiling". Tape out at step 72 is when the circuit design is completed and a data representation of the circuit design is stored on a tape (or memory), which can then be sent to a wafer fabrication facility.

Figure 5:
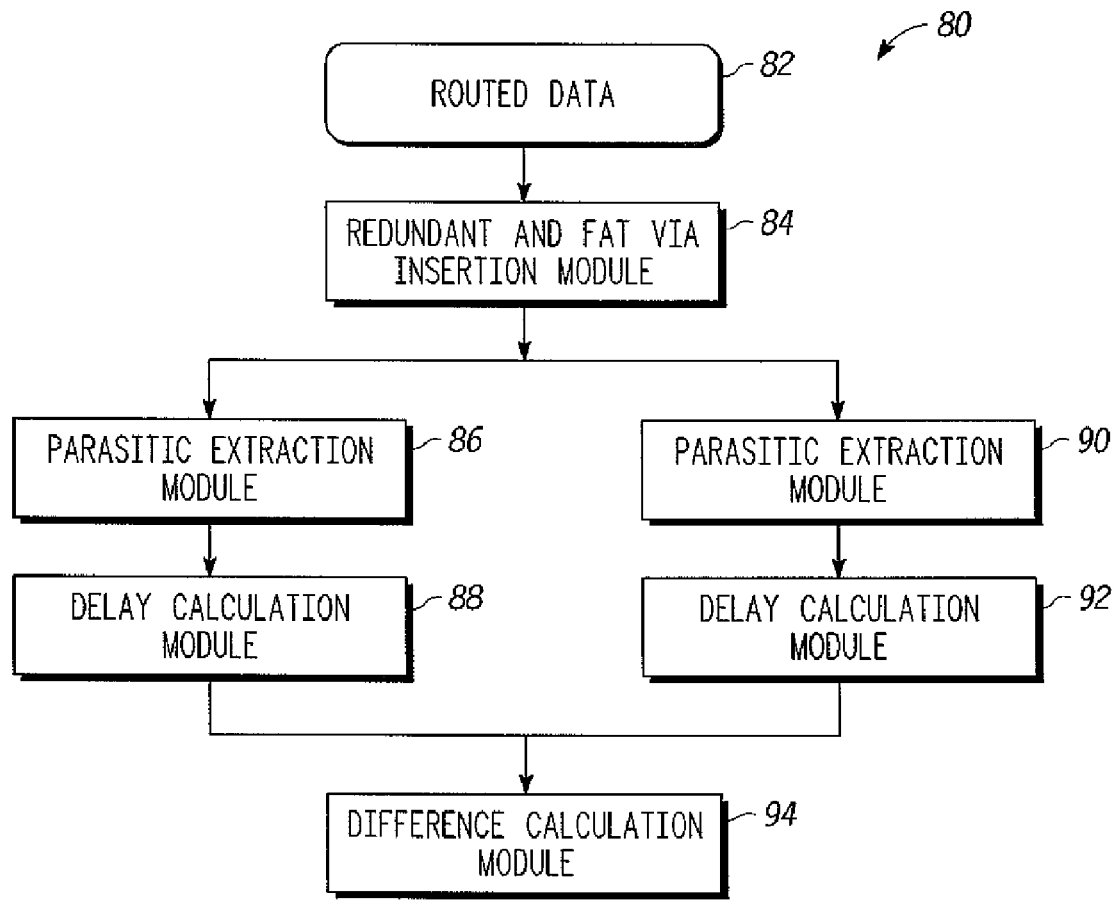
FIG. 5 is a schematic block diagram of a system for implementing an embodiment of the present invention.

Referring now to FIG. 5, a schematic diagram of a tool or system 80 for performing the analysis discussed above in accordance with an embodiment of the present invention is shown. The system 80 uses the routed data generated at step 46. Block 82 shows the routed design data prior to the insertion of redundant vias and fat vias. Block 84, which is coupled to block 82, is a redundant and fat via insertion module, which adds the redundant and fat vias to the design. As previously discussed, a commercially available routing tool can be used to create the routed design data with the addition of redundant and fat vias, and use of a PERL script to further process this design data to generate the second design database that does not include redundant and fat vias.

The redundant via insertion module 84 is coupled to respective parasitic extraction modules 86 and 90. Although two parasitic extraction modules are shown, alternatively, a single module that separately receives the two sets of router data could be used. Again, a commercially available tool such as StarRC-XT® from Synopsys, Inc. can be used to extract parasitic data from both circuit designs with redundant and fat vias and without redundant and fat vias at blocks 86 and 90.

The parasitic extraction modules 86 and 90 are coupled to respective delay calculation modules 88 and 92. The delay calculation modules 88 and 92 calculate the circuit element delays for the router data with redundant vias and the router data without redundant vias, respectively. A commercially available tool, such as Primetime® available from Synopsys, Inc. can be used to calculate delay in each timing stage of both circuit designs (with redundant and fat vias and without redundant and fat vias), at the delay calculation modules 88 and 92. A difference calculation module 94 is coupled to the delay calculation modules 88 and 92. The difference calculation module 92 calculates the delay differences between the two designs. A Perl script that can be run within Primetime® may be used to calculate the delay differences. Although specific examples of tools for generating the various stages of design data have been provided, those of skill in the art will understand that other suitable tools are available, and thus, the invention is not limited to the above examples.

The present invention provides a method for performing timing analysis on an integrated circuit design that addresses the issues of higher stage delay due to the effect of lower interconnect resistance on driver delay and driver output transition greater than effect of reduced. RC on net propagation delay; higher stage output transition time due to the effects of lower interconnect resistance on driver output transition greater than effect of reduced RC on slew degradation across interconnects; reductions in stage delay due to the effects of interconnect resistance on driver delay and driver output transition lesser than effect of reduced RC on net propagation delay; and lower stage output transition time due to the effects of lower interconnect resistance on driver output transition less than effect of reduced RC on slew degradation across interconnects. The dual delay calculations of the present invention may be performed in parallel so that there is no adverse affect on runtime; CPU and memory usage are less for delay calculation than for timing analysis so the only time penalty, if any, occurs in generating the delta-delay file. Further, there is no impact on design cycle time or resources, and timing analyses are performed only on one set of data.

Other embodiments of the invention will be apparent to those skilled in the art from consideration of the specification and practice of the invention. Furthermore, certain terminology has been used for the purposes of descriptive clarity, and not to limit the present invention. The embodiments and preferred features described above should be considered exemplary, with the invention being defined by the appended claims.

The invention claimed is:

1. A method of conducting timing analysis on an integrated circuit design, comprising:

performing physical synthesis on the integrated circuit design;

performing a first routing operation on the synthesized design to generate a first routed design that includes redundant vias, and storing the first routed design in a first design database;

performing a second routing operation on the synthesized design to generate a second routed design that does not include redundant vias, and storing the second routed design in a second design database;

performing extractions on the first and second designs using the first and second design databases to generate first and second extraction files using a system for performing timing analysis;

performing first and second delay calculations on the first and second extractions files;

comparing the first and second delay calculations to determine a delay difference between the first and second designs; and performing timing analysis using the delay difference.

2. The method of conducting timing analysis according to claim 1, further comprising:
ascertaining that results of the timing analysis do not meet a timing requirement;
performing a further routing operation on the second routed design to generate a third routed design and storing the third routed design in a third database;
performing extraction on the third routed design using the third database to generate a third extraction file;
performing delay calculations on the third extraction file;
comparing the first and third delay calculations to determine a new delay difference between the first and third designs; and
performing timing analysis using the new delay difference.

3. The method of conducting timing analysis of claim 1, wherein performing the timing analysis further includes incorporating the delay difference into the second extraction file.

4. The method of conducting timing analysis of claim 1, wherein the first delay calculation generates a first minimum delay and the second delay calculation generates a second minimum delay, and a delay difference thereof is used for a hold timing check.

5. The method of conducting timing analysis of claim 1, wherein the first delay calculation generates a first maximum delay and the second delay calculation generates a second maximum delay, and a delay difference thereof is used for a setup timing check.

6. The method of conducting timing analysis of claim 1, wherein the step of performing timing analysis includes performing a static timing analysis, electromigration analysis, and signal integrity check.

7. The method of conducting timing analysis of claim 1, further comprising the steps of:
performing GDS integration on the first design using the first design database to generate a GDS file; and
performing chip level static timing analysis on the GDS file.

8. The method of conducting timing analysis of claim 7, further comprising the step of performing design rules checks using the GDS file.

9. The method of conducting timing analysis of claim 8, further comprising the step of performing a rule-based tiling operation on the GDS file.

10. The method of conducting timing analysis of claim 1, wherein the first routing operation generates the first routed design and the first routed design includes redundant vias and fat vias.

11. A system for conducting timing analysis on an integrated circuit design, comprising:
a router for routing the integrated circuit design wherein the router generates a first routed design that includes redundant vias and a second routed design that does not include redundant vias;
an extraction module for extracting parasitics from the first and second routed designs;
a delay calculation module for calculating a plurality of first delay values and a plurality of second delay values respectively for each of the first and second designs;
a delay difference calculation module for comparing the first and second delay values and generating a plurality of delay differences therefrom; and
a timing analysis module for performing a timing analysis on the first design using the plurality of delay differences.

12. The system for conducting timing analysis on an integrated circuit design of claim 11, wherein the plurality of first delay values and the plurality of second delay values each include a minimum delay and a maximum delay for a timing stage in each of the first and second designs.

13. The system for conducting timing analysis on an integrated circuit design of claim 12, wherein the plurality of delay differences includes a maximum delay difference, which is obtained from a difference between a maximum delay from the plurality of first delay values and a maximum delay from the plurality of second delay values.

14. The system for conducting timing analysis on an integrated circuit design of claim 13, wherein the maximum delay difference is incorporated into the maximum delay from the plurality of second delay values before performing the timing analysis for a setup check.

15. The system for conducting timing analysis on an integrated circuit design of claim 12, wherein the plurality of delay differences includes a minimum delay difference, which is obtained from a difference between a minimum delay from the plurality of first delay values and a minimum delay from the plurality of second delay values.

16. The system for conducting timing analysis on an integrated circuit design of claim 15, wherein the minimum delay difference is incorporated into the minimum delay from the plurality of second delay values before performing the timing analysis for a hold check.

* * * * *